(12) United States Patent
Zhou

(10) Patent No.: US 10,770,590 B2
(45) Date of Patent: Sep. 8, 2020

(54) SEMICONDUCTOR STRUCTURES AND FABRICATION METHODS THEREOF

(71) Applicants: Semiconductor Manufacturing International (Shanghai) Corporation, Shanghai (CN); SMIC New Technology Research and Development (Shanghai) Corporation, Shanghai (CN)

(72) Inventor: Fei Zhou, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/114,857

(22) Filed: Aug. 28, 2018

(65) Prior Publication Data
US 2019/0067467 A1 Feb. 28, 2019

(30) Foreign Application Priority Data

Aug. 31, 2017 (CN) .......................... 2017 1 0776697

(51) Int. Cl.
*H01L 21/768* (2006.01)
*H01L 29/78* (2006.01)
(Continued)

(52) U.S. Cl.
CPC ...... *H01L 29/785* (2013.01); *H01L 21/28088* (2013.01); *H01L 21/28247* (2013.01);
(Continued)

(58) Field of Classification Search
CPC ............ H01L 29/785; H01L 21/28247; H01L 23/485; H01L 21/28088; H01L 21/823864;
(Continued)

(56) References Cited

U.S. PATENT DOCUMENTS 9,865,697 B1 * 1/2018 Hsueh ................ H01L 29/4966
2001/0029114 A1 * 10/2001 Vulpio ................ C23C 16/308
438/794

(Continued)

FOREIGN PATENT DOCUMENTS

CN 1649093 A 8/2005
CN 103107091 A 5/2013
(Continued)

OTHER PUBLICATIONS

This journal is © The Royal Society of Chemistry 2014 J. Mater. Chem. A.*

*Primary Examiner* — Marcos D. Pizarro
*Assistant Examiner* — Sue Tang
(74) *Attorney, Agent, or Firm* — Anova Law Group, PLLC

(57) ABSTRACT

A method for fabricating a semiconductor structure includes providing a base substrate, including a substrate, a plurality of gate structures formed on the substrate, and a cap layer formed on the plurality of gate structures; removing the cap layer to form a trench on each gate structure; and forming a substitution layer in the trench. The dielectric constant of the substitution layer is smaller than the dielectric constant of the cap layer.

14 Claims, 6 Drawing Sheets

(51) Int. Cl.
   *H01L 21/8238* (2006.01)
   *H01L 29/08* (2006.01)
   *H01L 23/532* (2006.01)
   *H01L 29/423* (2006.01)
   *H01L 29/66* (2006.01)
   *H01L 21/28* (2006.01)
   *H01L 29/49* (2006.01)
   *H01L 23/485* (2006.01)

(52) U.S. Cl.
   CPC .. *H01L 21/76829* (2013.01); *H01L 21/76897* (2013.01); *H01L 21/823864* (2013.01); *H01L 23/485* (2013.01); *H01L 23/5329* (2013.01); *H01L 29/0847* (2013.01); *H01L 29/42372* (2013.01); *H01L 29/4991* (2013.01); *H01L 29/6653* (2013.01); *H01L 29/6681* (2013.01); *H01L 29/66545* (2013.01); *H01L 29/42376* (2013.01); *H01L 29/7848* (2013.01)

(58) Field of Classification Search
   CPC ......... H01L 21/76897; H01L 21/76829; H01L 29/66545; H01L 29/42372; H01L 23/5329; H01L 29/0847; H01L 29/6681
   See application file for complete search history.

(56) References Cited

U.S. PATENT DOCUMENTS

| | | | |
|---|---|---|---|
| 2005/0045865 A1* | 3/2005 | Wang | H01L 21/7682 257/10 |
| 2013/0240990 A1* | 9/2013 | Yin | H01L 29/456 257/343 |
| 2016/0284817 A1* | 9/2016 | Basker | H01L 23/485 |
| 2016/0336426 A1* | 11/2016 | Chang | H01L 29/66545 |
| 2017/0103896 A1* | 4/2017 | Hung | H01L 29/66545 |
| 2018/0174920 A1* | 6/2018 | Kim | H01L 21/8238 |

FOREIGN PATENT DOCUMENTS

| | | |
|---|---|---|
| CN | 103715134 A | 4/2014 |
| CN | 103794506 A | 5/2014 |

* cited by examiner

SEMICONDUCTOR STRUCTURES AND FABRICATION METHODS THEREOF

CROSS-REFERENCES TO RELATED APPLICATIONS

This application claims the priority of Chinese Patent Application No. CN201710776697.5, filed on Aug. 31, 2017, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

As integration circuits (ICs) are developed toward very-large-scale integration (VLSI) circuits, the density of circuits in the ICs increases. The number of components included in ICs also becomes larger and larger, and accordingly, the sizes of the components are reduced. As the most fundamental semiconductor devices, transistors have been widely used in ICs. With the increase of the device density and the integration level of semiconductor devices, the sizes of the transistors also decrease. Therefore, the distance between the source, the drain, and the gate of the transistors becomes smaller and smaller.

Moreover, as the density of the circuits increases, the wafer surface may not be able to provide enough area for the fabrication of connection wires. As the size of the device becomes smaller, in order to meet the requirements on interconnections, the design of double-layer or multiple-layer metal interconnection wires becomes one of the methods that are commonly used in VLSI technology. The connections between different metal layers or between metal layers and semiconductor devices may be realized through plugs.

In the meantime, as the process node of ICs becomes smaller, the distance between the source, the drain, and the gate of the transistor gradually decreases, resulting in an increase in the processing difficulty for forming the plugs on the source, the drain, and the gate of the transistor. For example, it may not be able to directly form contact holes through photolithography and etching processes. Therefore, a self-aligned process is introduced into the process for forming the plugs.

However, a semiconductor structure containing plugs formed by the self-aligned process may often have an overly large parasitic capacitance, which may further lead to degraded performance of the formed semiconductor structure. The disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor structure. The method includes providing a base substrate, including a substrate, a plurality of gate structures formed on the substrate, and a cap layer formed on the plurality of gate structures; removing the cap layer to form a trench on each gate structure; and forming a substitution layer in the trench. The dielectric constant of the substitution layer is smaller than the dielectric constant of the cap layer.

Another aspect of the present disclosure provides a semiconductor structure. The semiconductor structure includes a substrate; a plurality of gate structures, formed on the substrate; and a substitution layer, formed on the plurality of gate structures. The dielectric constant of the substitution layer is smaller than the dielectric constant of silicon nitride.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
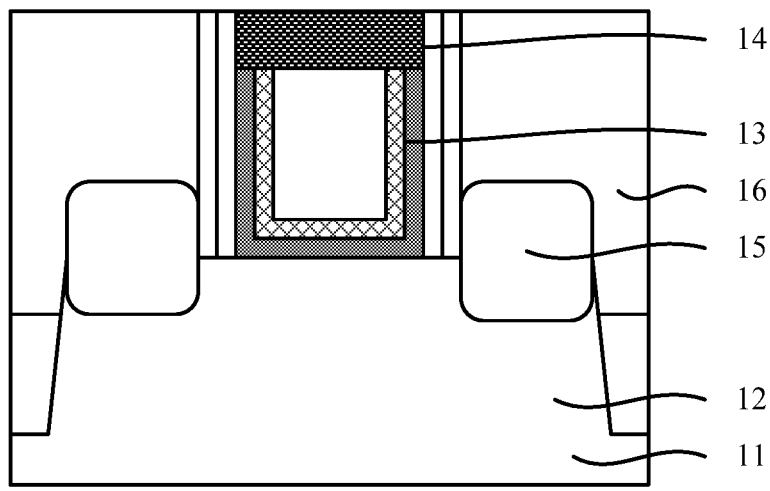
FIGS. 1-2 illustrate schematic cross-section views of structures at various stages in a process for fabricating a semiconductor structure.
Figure 2:
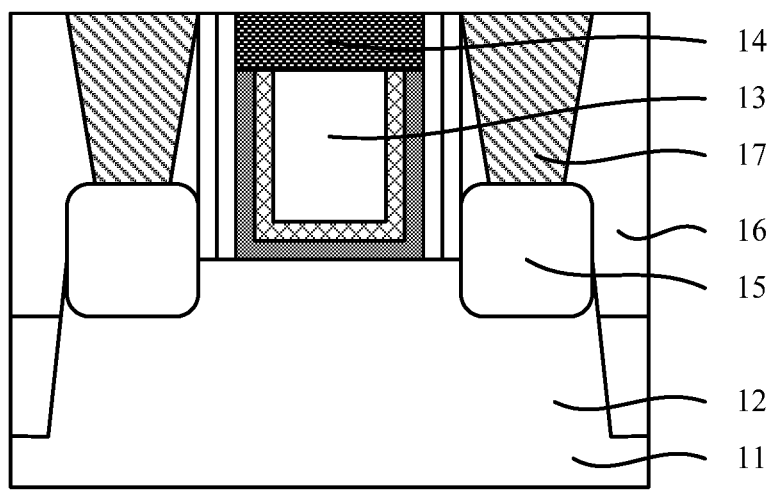

FIGS. 1-2 illustrate schematic cross-section views of structures at various stages in a process for fabricating a semiconductor structure.

Referring to FIG. 1, a base substrate is provided. The base substrate includes a substrate 11, a fin structure 12 formed on the substrate 11, a gate structure 13 formed on the fin structure 12, a cap layer 14 formed on the gate structure 13, a source/drain doped region 15 formed in the fin structure 12 on each side of the gate structure 13, and an interlayer dielectric layer 16 formed on the source/drain doped region 15.

Referring to FIG. 2, a contact hole (not shown) is formed in the interlayer dielectric layer 16 on each side of the gate structure 13. A corresponding source/drain doped region 15 is exposed at the bottom of the contact hole. Further, a plug 17 is formed in each contact hole.

According to the fabrication process, the cap layer 14 is used as the etch mask to form the contact holes, and thus the cap layer 14 defines the position of each plug 17. In addition, the cap layer 14 also protects the gate structure 13 during the fabrication process. Therefore, the cap layer 14 is often made of a material with a relatively high density, such as $SiN_x$, and accordingly, the dielectric constant of the material of the cap layer 14 is usually relatively large. When the material of the cap layer 14 has a relatively large dielectric constant, the average dielectric constant of the material around the gate structure 13 may increase such that the parasitic capacitance associated with the gate structure 13 may also increase. Therefore, the performance of the formed semiconductor structure may be degraded.

Moreover, as the size of the device decreases, the distance between the source, the drain, and the gate structure 13 may also be reduced. Accordingly, the distance between each plug 17 and the gate structure 13 may also be reduced. The large dielectric constant of the material of the cap layer 14 may lead to an overly large average dielectric constant for the material between the gate structure 13 and the plug 17. As such, a relatively large parasitic capacitance may exist between the gate structure 13 and the plug 17, causing degradation of the performance of the formed semiconductor structure.

Figure 11:
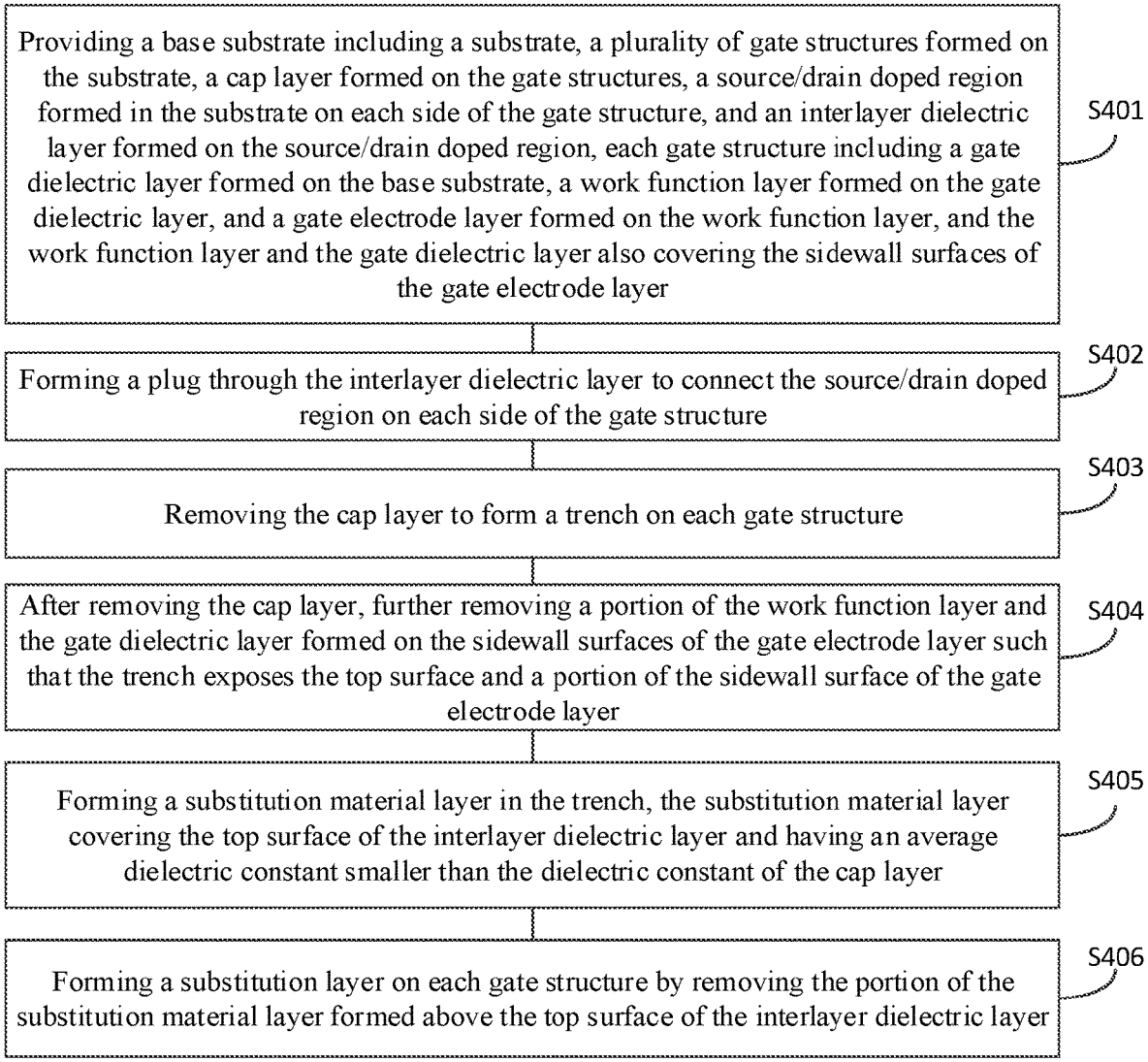
FIG. 11 illustrates a flowchart of an exemplary method for fabricating a semiconductor device consistent with various embodiments of the present disclosure.

The present disclosure provides a method for forming a semiconductor structure. FIG. 11 illustrates a flowchart of an exemplary method for fabricating a semiconductor device consistent with various embodiments of the present disclosure. FIGS. 3-8 illustrate schematic cross-section views of semiconductor structures at certain stages of the exemplary method.

Figure 3:
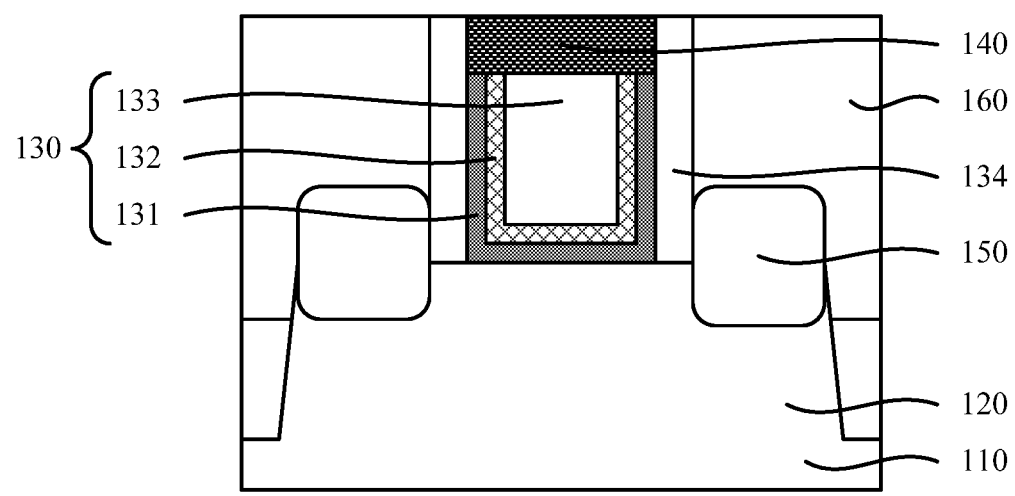
FIGS. 3-8 illustrate schematic cross-section views of semiconductor structures at certain stages of an exemplary method for fabricating a semiconductor structure consistent with some embodiments of the present disclosure.

Referring to FIG. 11, a base substrate may be provided; the base substrate may include a substrate, a plurality of gate structures formed on the substrate, a cap layer formed on the gate structures, a source/drain doped region formed in the substrate on each side of the gate structure, and an interlayer dielectric layer formed on the source/drain doped region; each gate structure may include a gate dielectric layer formed on the base substrate, a work function layer formed on the gate dielectric layer, and a gate electrode layer formed on the work function layer; the work function layer and the gate dielectric layer also cover the sidewall surfaces of the gate electrode layer (S401). FIG. 3 illustrates a schematic cross-section view of a semiconductor structure consistent with some embodiments of the present disclosure.

Referring to FIG. 3, a base substrate may be provided. The base substrate may include a substrate 110, a plurality of gate structures 130 formed on the substrate 110, and a cap layer 140 formed on the plurality of gate structures 130. For illustrative purposes, in FIG. 3, only one gate structure 130 is provided as an example to further illustrate the process for fabricating the semiconductor structure.

The base substrate may provide a process basis for subsequent steps according to the fabrication method. The substrate 110 may be used to provide a process platform.

In one embodiment, the substrate 110 may be made of a single-crystalline silicon. In other embodiments, the substrate may be made of polycrystalline silicon, amorphous silicon, germanium, SiGe, SiC, GaAs, InAs, or any other appropriate semiconductor materials. Alternatively, the substrate may be made of silicon on insulator (SOI), germanium on insulator (GOI), glass, or any other type of substrate material. The material of the substrate may be a material that is suitable for processing needs or can be easily integrated.

In one embodiment, the semiconductor structure may include a plurality of fin structures corresponding to the plurality of gate structures. Therefore, corresponding to the gate structure 130 shown in FIG. 2, a fin structure 120 may be formed on the substrate 110, and the channel of the semiconductor structure may be formed in the fin structure 120.

In one embodiment, the fin structure 120 and the substrate 110 may be made of a same material. For example, the fin structure 120 and the substrate 110 may both be made of single crystalline silicon. In one embodiment, the material of the fin structure 120 may be different form the material of the substrate 110. For example, the material of the substrate 110 may be single crystalline silicon, and the material of the fin structure 120 may be germanium, SiGe, SiC, GaAs, InAs, or any other semiconductor material different from silicon.

In one embodiment, the substrate 110 and the fin structure 120 may be formed simultaneously. The process for forming the substrate 110 and the fin structure 120 may include the following exemplary steps. An initial substrate may be provided. A patterned fin-structure mask layer (not labeled) may be formed on the surface of the initial substrate. Further, a portion of the initial substrate may be removed through an etching process using the fin-structure mask layer as an etch mask. As such, the substrate 110 and the fin structure 120 protruding from the surface of the substrate 110 may be formed.

In one embodiment, the semiconductor structure may also include an isolation layer (not labeled), formed on the substrate 110 between adjacent gate structures 120.

The isolation layer may cover a portion of the sidewall surfaces of the fin structure 120, and the top surface of the isolation layer may be lower than the top surface of the fin structure 120. The isolation layer, used as an isolation structure of the semiconductor structure to be formed, may be able to electrically isolate adjacent devices and also electrically isolate adjacent fin structures. The isolation layer may be formed on the portion of the substrate 110 exposed between the plurality of fin structures 120, and the height of the isolation layer may be smaller than the height of the fin structures 120.

In one embodiment, the isolation layer may be made of $SiO_x$. In other embodiments, the isolation layer may be made of $SiN_x$, SiON, or any other appropriate insulating material.

In one embodiment, the process for forming the isolation layer may include the following exemplary steps. An isolation material layer (not shown) may be formed on the portion of the substrate 110 exposed between the plurality of fin structures 120. The isolation material layer may cover the top surfaces of the fin structures 120. The portion of the isolation material layer formed on the top surfaces of the fin structures 120 may be removed by polishing. A fin-structure mask layer (not shown) may then be formed on the top surface of the fin structure 120. Further, through an etching back process, a portion of the remaining isolation material layer may be removed to form the isolation layer. The isolation layer may thus expose the top surface and a portion of sidewall surfaces of the fin structure 120. During the etching back process, the fin-structure mask layer covering the top surface of the fin structure 120 may provide protection for the fin structure 120. The fin-structure mask layer may then be removed to expose the top surface of the fin structure 120.

The gate structure 130 may be used to control the on and the off states of the channel in the semiconductor structure to be formed.

In one embodiment, a fin structure 120 is formed on the substrate 110, and accordingly, the gate structure 130 may be formed across the fin structure 120 and covering a portion of the top and the sidewall surfaces of the fin structure 120.

In one embodiment, the gate structure 130 may be a metal gate structure. The gate structure 130 may include a gate dielectric layer 131 formed on the substrate 110 across the fin structure 120, a work function layer 132 formed on the gate dielectric layer 131, and a gate electrode layer 133 formed on the work function layer 132. The work function layer 132 and the gate dielectric layer may also cover the sidewall surfaces of the gate electrode layer 133.

The gate dielectric layer 131 may be used to realize electrical isolation between the gate structure 130 and the channel in the base substrate. The gate dielectric layer 131 may be made of a high-k dielectric material. The high-k dielectric material may refer to a dielectric material with a relative dielectric constant greater than the relative dielectric constant of $SiO_2$. In one embodiment, the gate dielectric layer 131 may be made of one or more of $HfO_2$, $ZrO_2$, HfSiO, HfSiON, HfTaO, HfTiO, HfZrO, and $Al_2O_3$.

In one embodiment, a fin structure 120 is formed on the substrate 110, and accordingly, the gate dielectric layer 131 may be formed across the fin structure 120 and covering a portion of the top and the sidewall surfaces of the fin structure 120.

In some embodiments, prior to forming the gate dielectric layer 131, the fabrication method may also include forming an interfacial layer (not shown) on the surface of the fin structure 120 to provide a desired interface for the formation of the gate dielectric layer 131. As such, the quality of the gate dielectric layer 131 may be improved, and thus the properties of the interface between the gate dielectric layer 131 and the fin structure 120 may be improved. Moreover, the interfacial layer may also be used to, together with the gate dielectric layer 131, form a multi-layer structure to realize electrical isolation between the gate structure and the channel in the base substrate. The interfacial layer may be made of $SiO_x$, and may be formed through a thermal oxidation process. Alternatively, the interfacial layer may be made of SiCON, or any other appropriate material. After forming the interfacial layer, the gate dielectric layer 131 may then be formed on the interfacial layer.

The work function layer 132 may be used to adjust the threshold voltage of the transistor in the semiconductor structure to be formed.

When the semiconductor structure to be formed is a P-type semiconductor structure, the work function layer 132 may be made of a P-type work function material. The P-type work function material may have a work function in a range of approximately 5.1 eV to 5.5 eV. The P-type work function material may include one or more of TiN, TaN, TaSiN, and TiSiN.

When the semiconductor structure to be formed is an N-type semiconductor structure, the work function layer 132 may be made of an N-type work function material. The N-type work function material may have a work function in a range of approximately 3.9 eV to 4.5 eV. The N-type work function material may include one or more of TiAl, TiAlC, TaAlN, TiAlN, TaCN, and AlN.

The gate electrode layer 133 may be used to connect external electrical circuits. In one embodiment, the gate dielectric layer 133 may be made of a material including one or more of W, Al, Cu, Ag, Au, Pt, Ni, and Ti.

In one embodiment, the base substrate may also include a source/drain doped region formed in the substrate 110 on each side of the gate structure 130, and an interlayer dielectric layer 160 formed on the source/drain doped region. The source/drain doped region may be used to form a source region or a drain region of the semiconductor structure.

In one embodiment, the source/drain doped region may include a stress layer 150 containing doping ions. When the semiconductor structure to be formed is a P-type semiconductor structure, the stress layer 150 may be doped with P-type ions. For example, the stress layer 150 may be made of SiGe or Si and doped with P-type ions, such as B ions, Ga ions, and/or In ions. When the semiconductor structure to be formed is an N-type semiconductor structure, the stress layer 150 may be doped with N-type ions. For example, the stress layer 150 may be made of SiC or Si and doped with N-type ions, such as P ions, As ions, and/or Sb ions.

The interlayer dielectric layer 160 may be used to electrically isolate adjacent semiconductor structures. In one embodiment, the interlayer dielectric layer 160 may be made of $SiO_x$. In other embodiments, the interlayer dielectric layer may be made of $SiN_x$, SiON, or any other appropriate dielectric material.

In one embodiment, the gate structure 130 may be formed by a high-k last metal gate last process. For example, the process for forming the gate structure 130 may include the following exemplary steps. After forming the plurality of fin structures 120, a plurality of dummy gate structures may be formed on the plurality of fin structures 120. A stress layer 150 may be formed in the fin structures 120 on the two sides of each dummy gate structure. After forming the stress layer 150, an interlayer dielectric layer 160 may be formed between adjacent dummy gate structures. The interlayer dielectric layer 160 may be formed on the stress layer 150 and may expose the top surface of each dummy gate structure. Further, a plurality of gate openings may be formed in the interlayer dielectric layer by removing the dummy gate structures. A gate dielectric layer 131 may then be formed in each gate opening, a work function layer 132 may be formed on the gate dielectric layer 131, and a gate electrode layer 133 may be formed on the work function layer 132.

Because the gate dielectric layer 131, the work function layer 132, and the gate electrode layer 133 are consecutively formed in the gate opening, the gate dielectric layer 131 and the work function layer 132 may be formed on the bottom and the sidewall surfaces of the gate opening. That is, the gate dielectric layer 131 and the work function layer 132 may be formed not only under the gate electrode layer 133, but also on the sidewall surfaces of the gate electrode layer 133. Therefore, the gate dielectric layer 131 and the work function layer 132 may be located between the gate electrode layer 133 and the fin structure 120 and also between the gate electrode layer and the interlayer dielectric layer 160.

In one embodiment, after forming the dummy gate structure and prior to forming the stress layer 150, the fabrication method may also include forming a sidewall spacer 134 on each sidewall surface of the dummy gate structure. Therefore, after removing the dummy gate structure, the formed gate opening may expose the sidewall spacers 134 at the sidewalls. Thus, the sidewall surfaces of the gate structure 130 formed in the gate opening may be covered by the sidewall spacers 134. That is, a sidewall spacer is formed on each sidewall surface of the gate structure 130.

The sidewall spacer 134 may include a protection sidewall spacer covering the sidewall surface of the dummy gate structure and an offset spacer formed on the sidewall surface of the protection sidewall spacer. The sidewall spacer 134 may provide protection for the corresponding sidewall surface of the dummy gate structure. Moreover, the sidewall spacer 134 may be used to define the position of the source/drain doped region.

The sidewall spacer 134 may be made of a material including one or more of $SiO_x$, $SiN_x$, SiC, SiCO, SiCON, SiON, BN, and BCN. The sidewall spacer 134 may have a single-layer structure or a multi-layer structure.

The cap layer 140 may be used as a mask to protect the gate structures 130 when forming a plurality of plugs in a subsequent process. The cap layer 140 may also define the position of each plug.

In one embodiment, the cap layer 140 may be made of $SiN_x$, and may be formed above the gate structure 130. The top surface of the cap layer 140 may be leveled with the top surface of the interlayer dielectric layer 160. In other embodiments, the cap layer may be made of any other material that is suitable for forming a mask. The cap layer may also be only formed on the gate electrode layer, and the top surfaces of the cap layer, the gate dielectric layer, the work function layer, and the interlayer dielectric layer may be leveled with each other.

In one embodiment, the process for forming the cap layer 140 may include the following exemplary steps. A portion of the gate structure 130 may be removed to form a cap-layer opening (not shown) in the interlayer dielectric layer. The cap-layer opening may then be filled up such that the cap layer 140 may be formed in the cap-layer opening.

Figure 4:
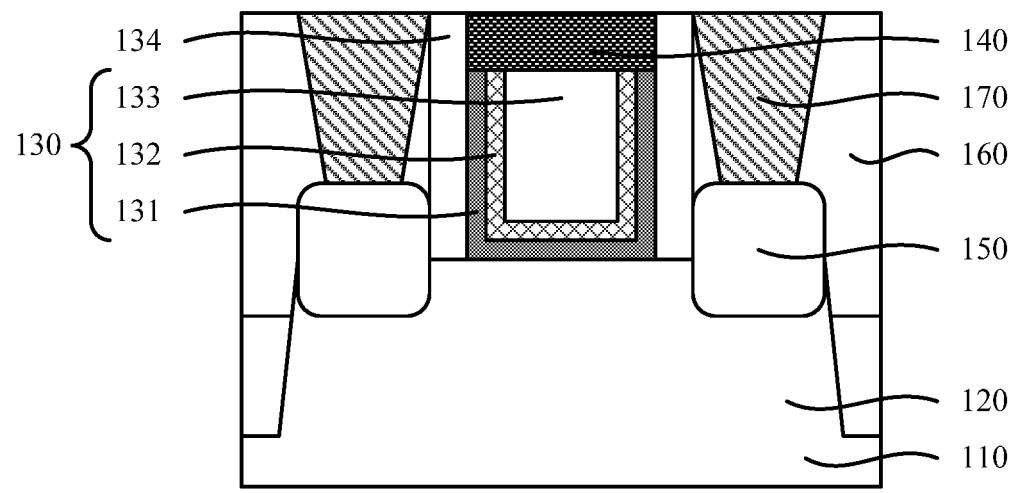

Further, returning to FIG. 11, a plug may be formed through the interlayer dielectric layer to connect the source/drain doped region on each side of the gate structure (S402). FIG. 4 illustrates a schematic cross-section view of a corresponding semiconductor structure consistent with some embodiments of the present disclosure.

Referring to FIG. 4, a plug 170 may be formed by a self-aligned process to connect the source/drain doped region 150 on each side of the gate structure 130. In one embodiment, the process for forming the plug may include the following exemplary steps. After providing the base substrate, a contact hole may be formed in the interlayer dielectric layer 160 using the cap layer 140 as a mask to expose a portion of the source/drain doped region 150 on each side of the gate structure 130. Further, the plug 170 may be formed in the contact hole.

The contact hole may provide a processing space for the formation of the plug 170. The plug 170 may be used to electrically connect the corresponding source/drain doped region to external electrical circuits.

The process for forming the plurality of contact holes may include the following exemplary steps. The interlayer dielectric layer 160 formed on the two sides of each gate structure 140 may be etched using the cap layer 140 as an etch mask to form a plurality of contact holes penetrating the interlayer dielectric layer. In one embodiment, the source/drain doped region may include a stress layer 150, and accordingly, the bottom of the contact hole may expose the stress layer 150.

The plug 170 may be made of a material including one or more of W, Al, Ag, Cr, Mo, Ni, Pb, Pt, Ti, Ta, and Cu. The plug 170 may be formed on the stress layer 150 and may fill up the contact hole. Therefore, the plug 170 may be electrically connected to the stress layer 150.

In one embodiment, the process for forming the contact hole and the plug 170 may be a process consistent with existing fabrication methods. The detailed description of the fabrication process for forming the contact hole and the plug 170 may not be provided here again.

Figure 5:
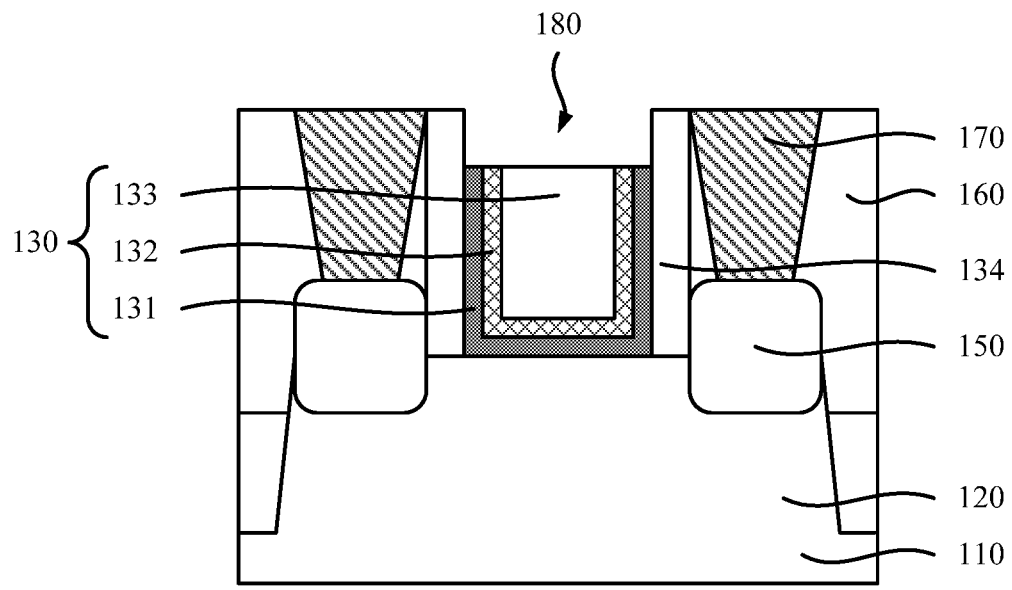
Figure 6:
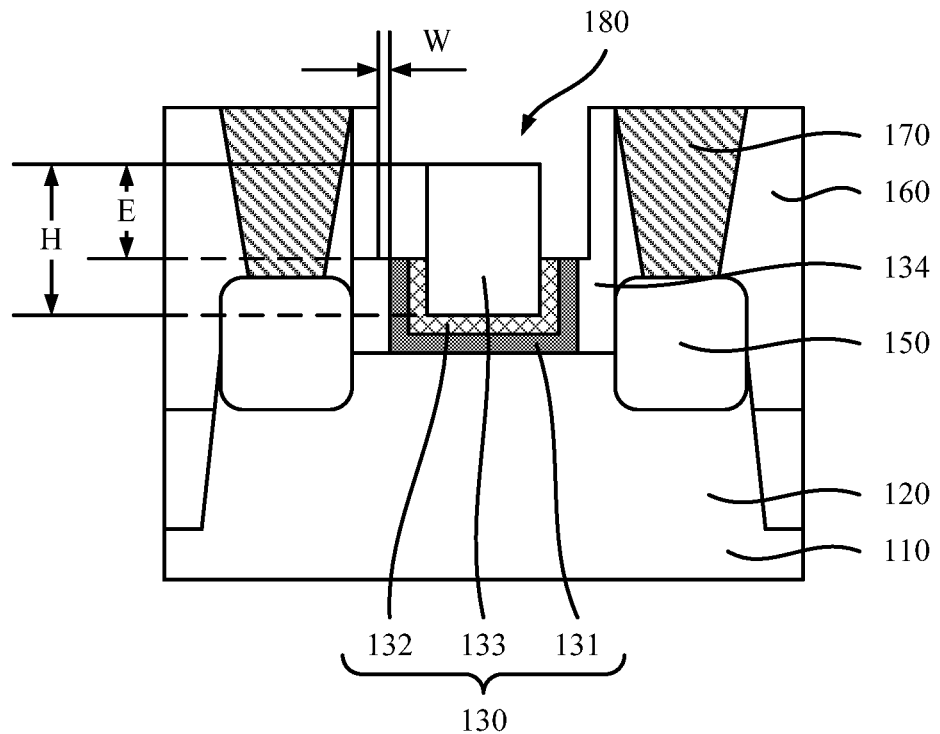

Further, returning to FIG. 11, the cap layer may be removed to form a trench on each gate structure (S403). FIG. 5-6 illustrate a schematic cross-section view of a corresponding semiconductor structure consistent with some embodiments of the present disclosure.

Referring to FIG. 5, the cap layer 140 (referring to FIG. 4) may be removed to form a trench 180. The bottom of the trench 180 may expose the top surface of the gate electrode 133 as well as the top surfaces of the work function layer 132 and the gate dielectric layer 131 formed on the sidewall surfaces of the gate electrode 133.

The trench 180 may be used to provide a process basis for forming a substitution layer in a subsequent process. The material of the cap layer 140 may have a large dielectric constant. Therefore, removing the cap layer 140 may be able to effectively reduce the average dielectric constant of the material between the gate structure 130 and the plug 170, and thus may be conducive to limiting the parasitic capacitance associated with the gate structure 130. As such, the parasitic capacitance between the gate structure 130 and the plug 170 may be reduced, and the performance of the formed semiconductor structure may be improved.

In one embodiment, the cap layer 140 (referring to FIG. 4) is formed on the gate structure 130. Therefore, after removing the cap layer 140, a trench 180 may be formed in the interlayer dielectric layer 160. The bottom of the trench 180 may expose the gate electrode layer 133, the work function layer 132, and the gate dielectric layer 131, and the sidewalls of the trench 180 may expose the sidewall spacers 134.

In one embodiment, because the cap layer 140 is made of $SiN_x$, the cap layer 140 may be removed through a dry etching process. The process parameters of the dry etching process may include a process gas including $CF_4$, $CH_3F$, and $O_2$; a flow rate of $CF_4$ in a range of approximately 5 sccm to 800 sccm; a flow rate of $CH_3F$ in a range of approximately 8 sccm to 600 sccm; a flow rate of $O_2$ in a range of approximately 10 sccm to 1000 sccm; a process pressure in a range of approximately 10 mTorr to 2000 mTorr; an RF power in a range of approximately 10 W to 800 W; a voltage in a range of 0 V to approximately 300 V; and an etching time in a range of approximately 4 s to 5000 s.

In one embodiment, the gate structure 130 includes a gate electrode layer 133, and a work function layer 132 and a gate dielectric layer 131 formed on the sidewall surfaces of the gate electrode 133. Therefore, the bottom of the trench 180 may expose the gate electrode layer 133, the work function layer 132, and the gate dielectric layer 131.

Further, returning to FIG. 11, a portion of the work function layer and the gate dielectric layer formed on the sidewall surfaces of the gate electrode layer may be removed such that the trench may expose the top surface and a portion of the sidewall surface of the gate electrode layer (S404). FIG. 6 illustrates a schematic cross-section view of a corresponding semiconductor structure consistent with some embodiments of the present disclosure.

Referring to FIG. 6, a portion of the work function layer 132 and the gate dielectric layer 131 formed on the sidewall surfaces of the gate electrode layer 133 may be removed. As such, the trench 180 may further expose a top portion of each sidewall surface of the gate electrode layer 133. Therefore, the trench 180 may expose the top surface and a portion of the sidewall surfaces of the gate electrode layer 133.

In one embodiment, the work function layer 132 and the gate dielectric layer 131 may cover the sidewall surfaces of the gate electrode layer 133. That is, the work function layer 132 and the gate dielectric layer 131 may be located between the gate electrode layer 133 and the plug 170. Therefore, removing the top portion of the work function layer 132 and the gate dielectric layer 131 may be able to effectively reduce the average dielectric constant of the material between the gate structure 130 and the plug, and thus may be conducive to reducing the parasitic capacitance between the gate structure 130 and the plug 170 and improving the performance of the formed semiconductor structure.

In one embodiment, the portion of the work function layer 132 and the gate dielectric layer 131 formed on the sidewall surfaces of the gate electrode layer 133 may be removed by a dry etching process. The process parameters of the dry etching process may include a process gas including $CF_4$, $SF_6$, and $Cl_2$; a flow rate of $CF_4$ in a range of approximately 10 sccm to 500 sccm; a flow rate of $SF_6$ in a range of approximately 20 sccm to 800 sccm; a flow rate of $Cl_2$ in a range of approximately 6 sccm to 120 sccm; a process pressure in a range of approximately 10 mTorr to 2000 mTorr; an RF power in a range of approximately 10 W to 800 W; a voltage in a range of 0 V to approximately 300 V; and an etching time in a range of approximately 4 s to 5000 s.

In one embodiment, the height E of the portion of the gate electrode layer 133 exposed at the bottom of the trench 180 and the height H of the gate electrode layer 133 may have a ratio in a range of approximately 1:6 to 1:1.

The ratio of the height E of the portion of the gate electrode layer 133 exposed at the bottom of the trench 180 and the height H of the gate electrode layer 133 may not be too large or too small. When the ratio of the height E of the portion of the gate electrode layer 133 exposed at the bottom of the trench 180 and the height H of the gate electrode layer 133 is too large, the removed portion of the work function layer 132 and the gate dielectric layer 131 may not be enough to effectively reduce the average dielectric constant of the material, and thus may not be conducive to limiting the parasitic capacitance between the gate structure 130 and the plug 170. When the ratio of the height E of the portion of the gate electrode layer 133 exposed at the bottom of the trench 180 and the height H of the gate electrode layer 133 is too large, the gate dielectric layer 131 and the work function layer 132 at the bottom of the gate electrode layer 133 may be undesirably affected, which may cause degradation of the function of the gate structure 130.

In one embodiment, the height E of the portion of the sidewall surfaces of the gate electrode layer 133 exposed at the bottom of the trench 180 may be in a range of approximately 30 Å to 400 Å. As such, without affecting the function of the gate structure 130, the goal to reduce the average dielectric constant of the material may be achieved.

In one embodiment, a sidewall spacer 134 is formed on each sidewall surface of the gate structure 130. Therefore, after removing the cap layer 140, the sidewall surface of the trench 180 may expose the sidewall surface of the sidewall spacer 134. As shown in FIG. 6, the process for forming the trench 180 may also include removing a portion of the sidewall spacer 134 when removing the top portion of the gate dielectric layer 131 and the work function layer 132 formed on the sidewall surface of the gate structure 130.

By removing a portion of the sidewall spacer 134, the average dielectric constant of the material between the gate structure 130 and the plug 170 may be effectively reduced, which may be conducive to further reducing the parasitic capacitance between the gate structure 130 and the plug 170, and thus improve the performance of the formed semiconductor structure.

The thickness of the removed portion of the sidewall spacer 134 may not be too large or too small. When the thickness of the removed portion of the sidewall spacer 134 is too large, the ability of the sidewall spacer 134 in protecting the gate structure 130 may be degraded. When the thickness of the removed portion of the sidewall spacer 134 is too small, the amount of the sidewall spacer 134 may be small, which may not be able effectively reduce the average dielectric constant of the material, and thus may not be conducive to limiting the parasitic capacitance between the gate structure 130 and the plug 170.

In one embodiment, the removed portion of the sidewall spacer 134 may have a thickness W in a range of approximately 10 Å to 100 Å.

Figure 7:
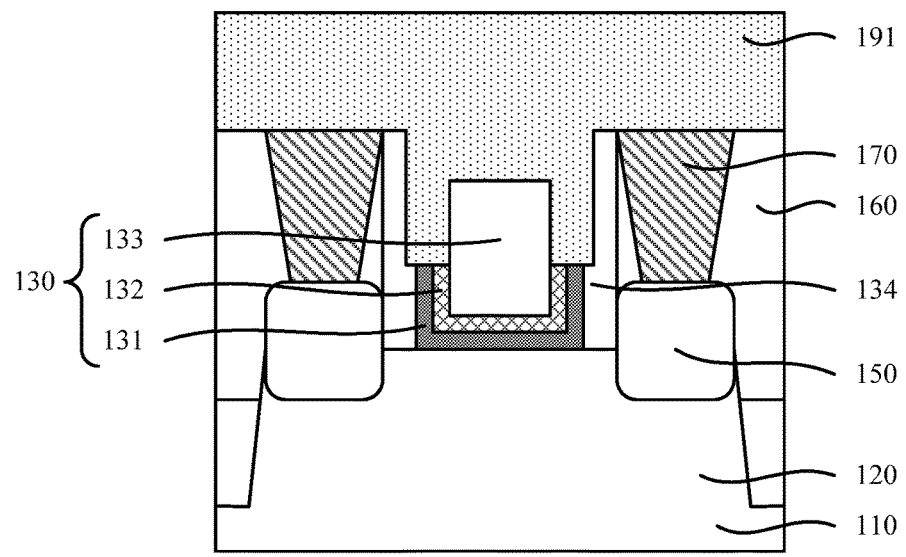

Further, returning to FIG. 11, a substitution material layer may be formed in the trench, the substitution material layer may also cover the top surface of the interlayer dielectric layer, and the substitution material layer may be made of a material with a dielectric constant smaller than the dielectric constant of the material of the cap layer (S405). FIG. 7 illustrates a schematic cross-section view of a semiconductor structure consistent with some embodiments of the present disclosure.

Referring to FIG. 7, a substitution material layer 191 may be formed in the trench 180 and also on the top of the interlayer dielectric layer 160. The substitution material layer 191 may be made of a material with a dielectric constant smaller than the dielectric constant of the material of the cap layer 140 (referring to FIG. 4). In one embodiment, because the cap layer 140 is made of $SiN_x$, the material of the substitution material layer 191 may have a dielectric constant smaller than the dielectric constant of $SiN_x$.

In one embodiment, the substitution material layer 191 may be formed to fill up the trench 180. By forming the substitution material layer 191 to fill up the trench 180, the reliability and the stability of the formed semiconductor structure may be effectively improved. The substitution material layer 191 may be made of $SiO_x$, and the substitution material layer 191 may be formed by a process including one or two of plasma enhanced chemical vapor deposition (PECVD), high density plasma chemical vapor deposition (HDPCVD), and any other deposition that demonstrates strong filling ability. The formed substitution material layer 191 may also cover the top surface of the interlayer dielectric layer 160.

Figure 8:
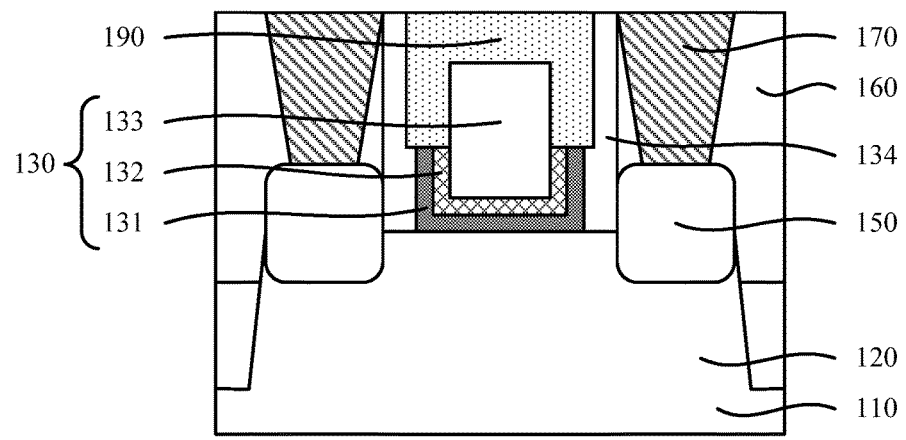

Further, returning to FIG. 11, the portion of the substitution material layer formed above the top surface of the interlayer dielectric layer may be removed to form a substitution layer (S406). FIG. 8 illustrates a schematic cross-section view of a corresponding semiconductor structure consistent with some embodiments of the present disclosure.

Referring to FIG. 8, the portion of the substitution material layer 191 (referring to FIG. 7) formed above the top surface of the interlayer dielectric layer 160 may be removed to form a substitution layer 190. In one embodiment, the portion of the substitution material layer 191 formed above the top surface of the interlayer dielectric layer 160 may be removed through chemical mechanical polishing (CMP). The substitution layer 190 may fill up the trench 180 (referring to FIG. 6).

Because the substitution material layer 191 is made of a material with a dielectric constant smaller than the dielectric constant of the material of the cap layer 140 (referring to FIG. 4), the substitution layer 190 may also have a dielectric constant smaller than the dielectric constant of the cap layer 140. In one embodiment, the substitution layer 190 may have a dielectric constant in a range of approximately 2.5 to 3.9. By forming the substitution layer 190 into the trench 180, the stability of the formed semiconductor structure may be improve, and thus the manufacturing yield may be improved. Moreover, by forming the substitution layer 190 into the trench 180, the average dielectric constant of the material around the gate structure 130 may also be reduced, and thus the average dielectric constant of the material between the gate structure 130 and the subsequently-formed plug 170 may be effectively reduced, which may be conducive to limiting the parasitic capacitance associated with the gate structure 130, and thus reduce the parasitic capacitance between the gate structure 130 and the subsequently-formed plug 170. Therefore, the performance of the formed semiconductor structure may be improved.

In one embodiment, the dielectric constant of the substitution layer 190 may be smaller than the dielectric constant of the cap layer 140 (referring to FIG. 4). For example, the cap layer 140 may be made of $SiN_x$, and the substitution layer 190 may be made of $SiO_x$. The dielectric constant of $SiO_x$ is relatively small, and thus may be able to effectively reduce the average dielectric constant. In addition, $SiO_x$ demonstrates high compatibility with existing technology, and thus may effectively reduce the difficulty of the fabrication process, and reduce the influence on other part of the formed semiconductor structure.

Figure 9:
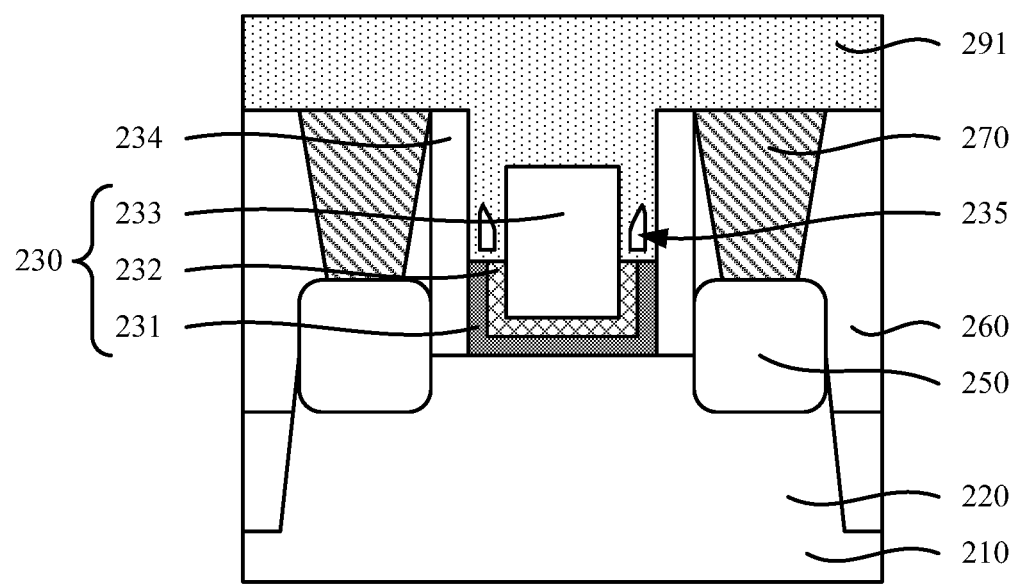
FIGS. 9-10 illustrate schematic cross-section views of semiconductor structures at certain stages of another exemplary method for fabricating a semiconductor structure consistent with some embodiments of the present disclosure.
Figure 10:
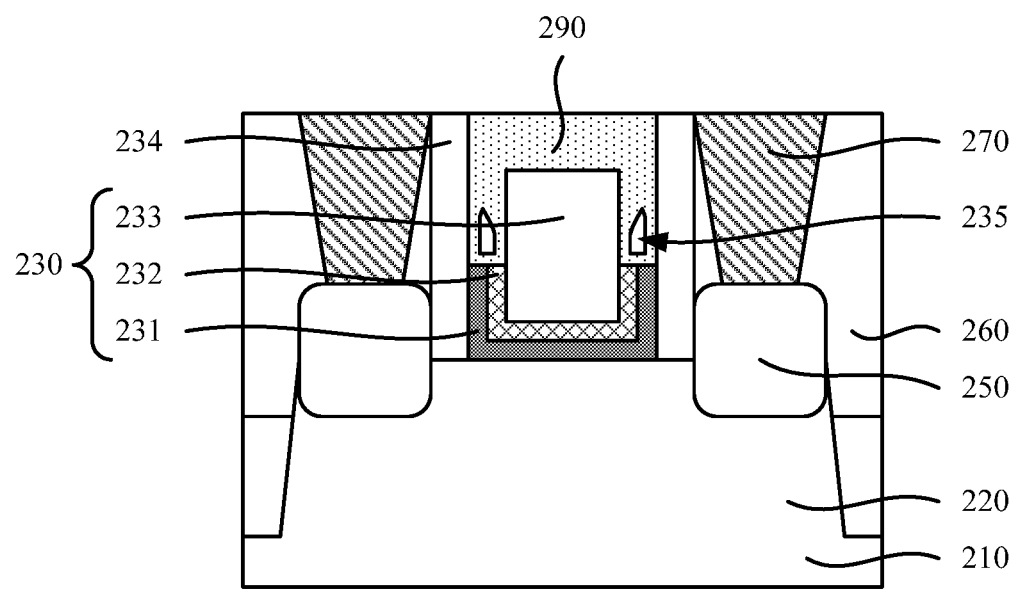

Further, the present disclosure also provides another method form forming a semiconductor structure. FIGS. 9-10 illustrate schematic cross-section views of semiconductor structures at certain stages of the exemplary fabrication method consistent with some embodiments of the present disclosure.

According to the fabrication method, a trench exposing a top portion of each gate structure may be formed through the same or similar steps described above in various embodiments.

For example, referring to FIG. 9, a base substrate including a substrate 210, a fin structure 220, a gate structure 230 formed on the substrate 210 across the fin structure 220, a source/drain doped region including a stress layer 250 formed in the fin structure 220 on each side of the gate structure 230, and an interlayer dielectric layer 260 formed on the source/drain doped region may be provided. The gate structure 230 may include a gate dielectric layer 231 formed across the fin structure 220, a work function layer 232 formed on the gate dielectric layer 231, and a gate electrode layer 233 formed on the work function layer 232. A plug 270 may be formed in the interlayer dielectric layer 260 to connect a corresponding source/drain doped region. Moreover, a sidewall spacer 234 may be formed on each side of the gate structure 230 to separate a corresponding plug 270 from the gate structure 230. Further, a trench (not shown) may be formed in the interlayer dielectric layer 260 to expose a top portion of the gate electrode layer 233. In one embodiment, the trench may be formed by removing a cap layer (not shown) initially formed above the gate structure 230 and a top portion of the gate dielectric layer 231 and the work function layer 232 formed on the sidewall surface of the gate electrode layer 233. The details of the fabrication process may be referred to S401-S404 as well as the accompanying drawings, i.e. FIGS. 3-6.

In one embodiment, as shown in FIG. 9, after forming the trench, the bottom of the trench may expose a top portion of the gate electrode layer 233. The top surface of the interlayer dielectric layer 260 may be higher than the top surface of the gate electrode layer 233, and the top surface of the gate electrode layer 233 may be higher than the top surfaces of the gate dielectric layer 231 and the work function layer 232.

Further, the method may include forming a substitution material layer to fill the trench. However, the substitution material layer may not completely fill up the trench, instead, a plurality of cavities may be formed in the substitution material layer. FIG. 9 illustrates a schematic cross-section view of a semiconductor structure consistent with some embodiments of the present disclosure.

Referring to FIG. 9, a substitution material layer 291 may be formed to fill the trench (not shown). When forming the substitution material layer 291 to fill the trench, the substitution material layer 291 may contain a plurality of holes 235. That is, a plurality of cavities 235 may be formed in the substitution material layer 291.

In one embodiment, after removing a portion of the gate dielectric layer 231 and the work function layer 232 formed on the sidewall surfaces of the gate electrode layer 233, the gap between the exposed portion of the sidewall surface of the gate electrode layer 233 and the sidewall spacer 234 may be small, and thus the gap may not be easily filled up. Therefore, when forming the substitution material layer 291 to fill the gap, the pinch phenomenon may likely occur such that a plurality of cavities 235 may be formed in the substitution material layer 291.

Because the dielectric constant of air or vacuum is relatively small, the formation of the plurality of cavities 235 may be able to effectively reduce the average dielectric constant of the substitution material layer 291. As such, the average dielectric constant of a subsequently-formed substitution layer may be effectively reduced, which may be conducive to limiting the parasitic capacitance associated with the gate structure 230, and thus reduce the parasitic capacitance between the gate structure 230 and the subsequently-formed plug 270. Therefore, the performance of the formed semiconductor structure may be improved.

In one embodiment, the substitution material layer 291 may be formed by a process including one or two of atmospheric pressure chemical vapor deposition (APCVD), subatmospheric pressure chemical vapor deposition (SACVD), and any other deposition that demonstrates weak filling ability.

The process environment during the formation of the substitution material layer 291 may be a vacuum or nearly a vacuum. As such, the plurality of cavities 235 formed in the substitution material layer 291 may be vacuum cavities or near-vacuum cavities. That is, the gas pressure in each cavity 235 may be very small.

Further, after forming the substitution material layer, the method may include removing the portion of the substitution material layer formed above the interlayer dielectric layer to form a substitution layer containing a plurality of cavities. FIG. 10 illustrates a schematic cross-section view of a semiconductor structure consistent with some embodiments of the present disclosure.

Referring to FIG. 10, after forming the substitution material layer 291, the portion of the substitution material layer 291 formed above the interlayer dielectric layer 260 may be removed to form a substitution layer 290. The top surface of the substitution layer 290 may be leveled with the top surface of the interlayer dielectric layer 260. The substitution layer 290 may include a plurality of cavities 235.

In one embodiment, forming the substitution layer 290 and the plurality of cavities 235 in the substitution layer 290, the average dielectric constant of the material around the gate structure 230 may be effectively reduced. Therefore, the average dielectric constant of the material between the gate structure 230 and the plug 270 may be effectively reduced, which may be conducive to reducing the parasitic capacitance, and thus may improve the performance of the formed semiconductor structure.

Further, the present disclosure also provides a semiconductor structure. FIG. 6 and FIG. 8 illustrates schematic cross-section views of semiconductor structures consistent with some embodiments of the present disclosure.

Referring to FIG. 6, the semiconductor structure may include a substrate 110, a plurality of gate structures 130 formed on the substrate 110, and a trench 180 formed above each gate structure 130. The trench 180 may expose a top portion of the gate structure 130. In one embodiment, as shown in FIG. 6, only one gate structure 130 is provided as an example to illustrate the disclosed semiconductor structure; however, in other embodiments, the semiconductor structure may include more than one gate structures 130.

The substrate 110 may be used to provide a process platform. In one embodiment, the substrate 110 may be made of a single-crystalline silicon. In other embodiments, the substrate may be made of polycrystalline silicon, amorphous silicon, germanium, SiGe, SiC, GaAs, InAs, or any other appropriate semiconductor materials. Alternatively, the substrate may be made of silicon on insulator (SOI), germanium on insulator (GOI), glass, or any other type of substrate material. The material of the substrate may be a material that is suitable for processing needs or can be easily integrated.

In one embodiment, the semiconductor structure may include a plurality of fin structures 120 corresponding to the plurality of gate structures 130. Therefore, corresponding to the gate structure 130 shown in FIG. 6, a fin structure 120 may be formed on the substrate 110, and the channel of the semiconductor structure may be formed in the fin structure 120.

In one embodiment, the fin structure 120 and the substrate 110 may be made of a same material. For example, the fin structure 120 and the substrate 110 may both be made of single crystalline silicon. In one embodiment, the material of the fin structure 120 may be different form the material of the substrate 110. For example, the material of the substrate 110 may be single crystalline silicon, and the material of the fin structure 120 may be germanium, SiGe, SiC, GaAs, InAs, or any other semiconductor material different from silicon.

In one embodiment, the semiconductor structure may also include an isolation layer (not labeled), formed on the substrate 110 between adjacent gate structures 120.

The isolation layer may cover a portion of the sidewall surfaces of the fin structure 120, and the top surface of the isolation layer may be lower than the top surface of the fin structure 120. The isolation layer, used as an isolation structure of the semiconductor structure to be formed, may be able to electrically isolate adjacent devices and also electrically isolate adjacent fin structures. The isolation layer may be formed on the portion of the substrate 110 exposed between the plurality of fin structures 120, and the height of the isolation layer may be smaller than the height of the fin structures 120.

In one embodiment, the isolation layer may be made of $SiO_x$. In other embodiments, the isolation layer may be made of $SiN_x$, SiON, or any other appropriate insulating material.

The gate structure 130 may be used to control the on and the off states of the channel in the semiconductor structure to be formed.

In one embodiment, a fin structure 120 is formed on the substrate 110, and accordingly, the gate structure 130 may be formed across the fin structure 120 and covering a portion of the top and the sidewall surfaces of the fin structure 120.

In one embodiment, the gate structure 130 may be a metal gate structure. The gate structure 130 may include a gate dielectric layer 131 formed on the substrate 110 across the fin structure 120, a work function layer 132 formed on the gate dielectric layer 131, and a gate electrode layer 133 formed on the work function layer 132. The work function layer 132 and the gate dielectric layer may also cover the sidewall surfaces of the gate electrode layer 133.

The gate dielectric layer 131 may be used to realize electrical isolation between the gate structure 130 and the channel in the base substrate. The gate dielectric layer 131 may be made of a high-k dielectric material. The high-k dielectric material may refer to a dielectric material with a relative dielectric constant greater than the relative dielectric constant of $SiO_2$. In one embodiment, the gate dielectric layer 131 may be made of one or more of $HfO_2$, $ZrO_2$, HfSiO, HfSiON, HfTaO, HfSiO, HfZrO, and $Al_2O_3$.

In one embodiment, the gate dielectric layer 131 may be formed across the fin structure 120 and covering a portion of the top and the sidewall surfaces of the fin structure 120.

The work function layer 132 may be used to adjust the threshold voltage of the transistor in the semiconductor structure.

When the semiconductor structure is a P-type semiconductor structure, the work function layer 132 may be made of a P-type work function material. The P-type work function material may have a work function in a range of approximately 5.1 eV to 5.5 eV. The P-type work function material may include one or more of TiN, TaN, TaSiN, and TiSiN.

When the semiconductor structure is an N-type semiconductor structure, the work function layer 132 may be made of an N-type work function material. The N-type work function material may have a work function in a range of approximately 3.9 eV to 4.5 eV. The N-type work function material may include one or more of TiAl, TiAlC, TaAlN, TiAlN, TaCN, and AlN.

The gate electrode layer 133 may be used to connect external electrical circuits. In one embodiment, the gate dielectric layer 133 may be made of a material including one or more of W, Al, Cu, Ag, Au, Pt, Ni, and Ti.

In one embodiment, the semiconductor structure may also include a sidewall spacer 134 formed on the sidewall surface of the gate structure 130.

The sidewall spacer 134 may include a protection sidewall spacer covering the sidewall surface of the gate structure 130 and an offset spacer formed on the sidewall surface of the protection sidewall spacer. The sidewall spacer 134 may provide protection for the corresponding sidewall surface of the gate structure 130. Moreover, the sidewall spacer 134 may be used to define the position of a source/drain doped region.

The sidewall spacer 134 may be made of a material including one or more of $SiO_x$, $SiN_x$, SiC, SiCO, SiCON, SiON, BN, and BCN. The sidewall spacer 134 may have a single-layer structure or a multi-layer structure.

In one embodiment, the semiconductor structure may also include a source/drain doped region, formed in the substrate 110 on each side of the gate structure 130; an interlayer dielectric layer 160, formed on the source/drain doped region; and a plug 170, formed through the interlayer dielectric layer 160 on each side of the gate structure 130 and connecting to the source/drain doped region. A source region or a drain region of the semiconductor structure may be formed in the source/drain doped region.

In one embodiment, the source/drain doped region may include a stress layer 150 containing doping ions. When the semiconductor structure is a P-type semiconductor structure, the stress layer 150 may be doped with P-type ions. For example, the stress layer 150 may be made of SiGe or Si and doped with P-type ions, such as B ions, Ga ions, and/or In ions. When the semiconductor structure is an N-type semiconductor structure, the stress layer 150 may be doped with N-type ions. For example, the stress layer 150 may be made of SiC or Si and doped with N-type ions, such as P ions, As ions, and/or Sb ions.

The interlayer dielectric layer 160 may be used to electrically isolate adjacent semiconductor structures. In one embodiment, the interlayer dielectric layer 160 may be made of $SiO_x$. In other embodiments, the interlayer dielectric layer may be made of $SiN_x$, SiON, or any other appropriate dielectric material.

The plug 170 may be used to electrically connect the source/drain doped region to external electrical circuits. The plug 170 may be formed on the stress layer 150 and may be electrically connected to the stress layer 150. In one embodiment, the plug 170 may be made of a material including one or more of W, Al, Ag, Cr, Mo, Ni, Pb, Pt, Ti, Ta, and Cu.

In one embodiment, the trench 180 may be formed by removing a cap layer (not shown) initially formed above the gate structure 130 and a top portion of the gate dielectric layer 131 and the work function layer 132 formed on the sidewall surface of the gate electrode layer 133.

The trench 180 may be used to provide a process basis for forming a substitution layer in a subsequent process. Forming the trench 180 may be able to effectively reduce the average dielectric constant of the material between the gate structure 130 and the plug 170, and thus may be conducive to limiting the parasitic capacitance associated with the gate structure 130. As such, the parasitic capacitance between the gate structure 130 and the plug 170 may be reduced, and the performance of the semiconductor structure may be improved.

In one embodiment, the gate structure 130 includes a gate electrode layer 133, and a work function layer 132 and a gate dielectric layer 131 formed on the sidewall surfaces of the gate electrode 133. Therefore, the bottom of the trench 180 may expose the gate electrode layer 133, the work function layer 132, and the gate dielectric layer 131. As shown in FIG. 6, the bottom of the trench 180 exposes the top surface and a portion of each sidewall surface of the gate electrode layer 133.

In one embodiment, the work function layer 132 and the gate dielectric layer 131 are formed on the sidewall surface of the gate electrode layer 133, and thus may be located between the gate electrode layer 133 and the plug 170. Therefore, forming the trench 180 to expose the top surface and a portion of each sidewall surface of the gate electrode layer 133, the average dielectric constant of the material between the gate structure 130 and the plug 170 may be effectively reduced, which may be conducive to reducing the parasitic capacitance between the gate structure 130 and the plug 170. As such, the performance of the semiconductor structure may be improved.

In one embodiment, the height E of the portion of the gate electrode layer 133 exposed at the bottom of the trench 180 and the height H of the gate electrode layer 133 may have a ratio in a range of approximately 1:6 to 1:1.

The ratio of the height E of the portion of the gate electrode layer 133 exposed at the bottom of the trench 180 and the height H of the gate electrode layer 133 may not be too large or too small. When the ratio of the height E of the portion of the gate electrode layer 133 exposed at the bottom of the trench 180 and the height H of the gate electrode layer 133 is too large, the removed portion of the work function layer 132 and the gate dielectric layer 131 may not be enough to effectively reduce the average dielectric constant of the material, and thus may not be conducive to limiting the parasitic capacitance between the gate structure 130 and the plug 170. When the ratio of the height E of the portion of the gate electrode layer 133 exposed at the bottom of the trench 180 and the height H of the gate electrode layer 133 is too large, the gate dielectric layer 131 and the work function layer 132 at the bottom of the gate electrode layer 133 may be undesirably affected, which may cause degradation of the function of the gate structure 130.

In one embodiment, the height E of the portion of the sidewall surfaces of the gate electrode layer 133 exposed at the bottom of the trench 180 may be in a range of approximately 30 Å to 400 Å. As such, without affecting the function of the gate structure 130, the goal to reduce the average dielectric constant of the material may be achieved.

In one embodiment, a sidewall spacer 134 is formed on each sidewall surface of the gate structure 130. Therefore, after removing the initially formed cap layer, the sidewall surface of the trench 180 may expose the sidewall surface of the sidewall spacer 134. In addition, as shown in FIG. 6, the process for forming the trench 180 may also include removing a portion of the sidewall spacer 134 when removing the top portion of the gate dielectric layer 131 and the work function layer 132 formed on the sidewall surface of the gate structure 130.

By removing a portion of the sidewall spacer 134, the average dielectric constant of the material between the gate structure 130 and the plug 170 may be effectively reduced, which may be conducive to further reducing the parasitic capacitance between the gate structure 130 and the plug 170, and thus improve the performance of the semiconductor structure.

The thickness of the removed portion of the sidewall spacer 134 may not be too large or too small. When the thickness of the removed portion of the sidewall spacer 134 is too large, the ability of the sidewall spacer 134 in protecting the gate structure 130 may be degraded. When the thickness of the removed portion of the sidewall spacer 134 is too small, the amount of the sidewall spacer 134 may be small, which may not be able effectively reduce the average dielectric constant of the material, and thus may not be conducive to limiting the parasitic capacitance between the gate structure 130 and the plug 170.

In one embodiment, the removed portion of the sidewall spacer 134 may have a thickness W in a range of approximately 10 Å to 100 Å.

Moreover, referring to FIG. 8, the disclosed semiconductor structure may also include a substitution layer 190 formed to fill up the trench 180 (referring to FIG. 6). The dielectric constant of the material of the substitution layer 190 may be smaller than the dielectric constant of $SiN_x$.

Because the dielectric constant of the material of the substitution layer 190 is small, by forming the substitution layer 190 into the trench 180, the stability of the semiconductor structure may be improve, and thus the manufacturing yield may be improved. Moreover, by forming the substitution layer 190 into the trench 180, the average dielectric constant of the material around the gate structure 130 may also be reduced, and thus the average dielectric constant of the material between the gate structure 130 and the subsequently-formed plug 170 may be effectively reduced, which may be conducive to limiting the parasitic capacitance associated with the gate structure 130, and thus reduce the parasitic capacitance between the gate structure 130 and the subsequently-formed plug 170. Therefore, the performance of the semiconductor structure may be improved.

In one embodiment, the dielectric constant of the substitution layer 190 may be smaller $SiN_x$. For example, the initially formed cap layer may be made of $SiN_x$, and the substitution layer 190 may be made of SiO$_x$. The dielectric constant of SiO$_x$ is relatively small, and thus may be able to effectively reduce the average dielectric constant. In addition, SiO$_x$ demonstrates high compatibility with existing technology, and thus may effectively reduce the difficulty of the fabrication process, and reduce the influence on other part of the semiconductor structure.

In one embodiment, using the substitution layer 190 to fill up the trench 180 may be able to effectively improve the reliability and the stability of the semiconductor structure.

Further, the present disclosure also provides another semiconductor structure. FIG. 10 illustrates a schematic cross-section view of an exemplary semiconductor structure consistent with some embodiments of the present disclosure.

Referring to FIG. 10, the semiconductor structure may include a substrate 210, a plurality of gate structures 230 formed on the substrate 210, and a trench (not shown) formed above each gate structure 230. The trench may expose a top portion of the gate structure 230.

In one embodiment, the semiconductor structure may include a plurality of fin structures 220 corresponding to the plurality of gate structures 230. Therefore, corresponding to the gate structure 230 shown in FIG. 10, a fin structure 220 may be formed on the substrate 210, and the channel of the semiconductor structure may be formed in the fin structure 220.

In one embodiment, the semiconductor structure may also include an isolation layer (not labeled), formed on the substrate 210 between adjacent gate structures 220.

The isolation layer may cover a portion of the sidewall surfaces of the fin structure 220, and the top surface of the isolation layer may be lower than the top surface of the fin structure 220. The isolation layer, used as an isolation structure of the semiconductor structure, may be able to electrically isolate adjacent devices and also electrically isolate adjacent fin structures. The isolation layer may be formed on the portion of the substrate 210 exposed between the plurality of fin structures 220, and the height of the isolation layer may be smaller than the height of the fin structures 220.

In one embodiment, a fin structure 220 is formed on the substrate 210, and accordingly, the gate structure 230 may be formed across the fin structure 220 and covering a portion of the top and the sidewall surfaces of the fin structure 220.

In one embodiment, the gate structure 230 may be a metal gate structure. The gate structure 230 may include a gate dielectric layer 231 formed on the substrate 210 across the fin structure 220, a work function layer 232 formed on the gate dielectric layer 231, and a gate electrode layer 233 formed on the work function layer 232. The work function layer 232 and the gate dielectric layer may also cover the sidewall surfaces of the gate electrode layer 233.

In one embodiment, the gate dielectric layer 231 may be formed across the fin structure 220 and covering a portion of the top and the sidewall surfaces of the fin structure 220.

In one embodiment, the semiconductor structure may also include a sidewall spacer 234 formed on the sidewall surface of the gate structure 230. The sidewall spacer 234 may include a protection sidewall spacer covering the sidewall surface of the gate structure 230 and an offset spacer formed on the sidewall surface of the protection sidewall spacer.

In one embodiment, the semiconductor structure may also include a source/drain doped region, formed in the substrate 210 on each side of the gate structure 230; an interlayer dielectric layer 260, formed on the source/drain doped region; and a plug 270, formed through the interlayer dielectric layer 260 on each side of the gate structure 230 and connecting to the source/drain doped region.

In one embodiment, the source/drain doped region may include a stress layer 250 containing doping ions.

In one embodiment, the semiconductor structure may also include a substitution layer 290 formed in the trench.

Referring to FIG. 10, in one embodiment, the semiconductor structure is substantially the same or similar to the semiconductor structure shown in FIG. 8, and thus the detailed description of the same or similar parts may be referred to the corresponding illustration in the above embodiments. However, the substitution layer 190 shown in FIG. 8 may fill up the entire trench (referring to FIG. 6), and the substitution layer 290 shown in FIG. 10 may include a plurality of cavities 235 shown in FIG. 8.

Referring to FIG. 10, in one embodiment, the gap between the sidewall surface of the gate electrode layer 233 and the sidewall spacer 234 may be small, and thus the gap may not be easily filled up. Therefore, when forming the substitution layer 290 to fill the gap, the pinch phenomenon may likely occur such that a plurality of cavities 235 may be formed in the substitution layer 290.

Because the dielectric constant of air or vacuum is relatively small, the formation of the plurality of cavities 235 may be able to effectively reduce the average dielectric constant of the substitution material layer 291. As such, the average dielectric constant of a subsequently-formed substitution layer may be effectively reduced, which may be conducive to limiting the parasitic capacitance associated with the gate structure 230, and thus reduce the parasitic capacitance between the gate structure 230 and the subsequently-formed plug 270. Therefore, the performance of the semiconductor structure may be improved.

In one embodiment, the substitution layer 290 may be formed from a substitution material layer. When forming the substitution material layer, the process environment may be a vacuum or nearly a vacuum. As such, the plurality of cavities 235 formed in the substitution material layer may be vacuum cavities or near-vacuum cavities. That is, the gas pressure in each cavity 235 formed in the subsequently-formed substitution layer 290 may be very small.

Compared to conventional semiconductor structures and fabrication methods, the disclosed semiconductor structures and fabrication methods may demonstrate the following advantages.

According to the disclosed semiconductor structures and fabrication methods, after forming a trench by removing the cap layer, a substitution layer is formed to fill the trench. Because the dielectric constant of the substitution layer is smaller than the dielectric constant, the formation of the substitution layer may be able to fill up the trench such that the stability and the manufacturing yield of the formed semiconductor structure may be ensured. In addition, the formation of the substitution layer may also be able to effectively reduce the average dielectric constant of the material around the gate structure. Therefore, the average dielectric constant of the material between the gate structure and the subsequently-formed plug may be effectively reduced, which may be conducive to limiting the parasitic capacitance associated with the gate structure, and thus may reduce the parasitic capacitance between the gate structure and the subsequently-formed plug. As such, the performance of the formed semiconductor structure may be improved.

According to the disclosed semiconductor structures and the fabrication methods, a source/drain doped region is formed in the substrate on each side of the gate structure, and a plug is formed on the source/drain doped region. The formation of the substitution layer may be able to effectively reduce the average dielectric constant of the material between the gate structure and the plug, which may suppress the parasitic capacitance between the gate structure and the plug. Therefore, the performance of the formed semiconductor structure may be improved.

According to the disclosed semiconductor structures and the fabrication methods, by controlling the fabrication process, a substitution layer filling up the entire trench or a substitution layer containing internal cavities may be formed. Because the dielectric constant of air or vacuum is relatively small, the formation of the internal cavities may be able to effectively reduce the average dielectric constant of the substitution layer, which may be conducive to limiting the parasitic capacitance associated with the gate structure, and thus reduce the parasitic capacitance between the gate structure and the subsequently-formed plug. Therefore, the performance of the formed semiconductor structure may be improved.

According to the disclosed semiconductor structures and the fabrication methods, after removing the cap layer, the portion of the work function layer and the gate dielectric layer of the gate structure formed on the sidewall surfaces of the gate electrode layer may be partially removed or may be fully removed. As such, at least a portion of the sidewall surfaces of the gate electrode layer may be exposed at the bottom of the trench. After forming the substitution layer to fill up the trench, the material between the gate structure and the plug may be partially replaced, such that the average dielectric constant may be reduced, and the parasitic capacitance may be suppressed.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
    providing a base substrate, including a substrate, a plurality of gate structures formed on the substrate, and a cap layer formed on the plurality of gate structures, wherein each gate structure includes a gate dielectric layer formed on the substrate, a work function layer formed on the gate dielectric layer, and a gate electrode layer formed on the work function layer;
    forming a sidewall spacer is on each sidewall surface of the gate structure;
    removing the cap layer, a top portion of the gate dielectric layer, a top portion of the work function layer, a portion of a top portion of the sidewall spacer to form a trench on each gate structure, wherein a top surface of a remaining portion of the gate dielectric layer, a top surface of a remaining portion of the work function layer, and a top surface of a bottom portion of the sidewall spacer are coplanar with each other; and
    forming a substitution layer in the trench, wherein:
        a dielectric constant of the substitution layer is smaller than a dielectric constant of the cap layer.

2. The method according to claim 1, wherein:
    the cap layer is made of silicon nitride; and
    the dielectric constant of the substitution layer is smaller than a dielectric constant of $SiN_x$.

3. The method according to claim 1, wherein:
    the dielectric constant of the substitution layer is in a range of approximately 2.5 to 3.9.

4. The method according to claim 1, wherein:
    the substitution layer is made of silicon oxide.

5. The method according to claim 1, wherein the base substrate further includes:
    a source/drain doped region formed in the substrate on each side of the gate structure; and
    an interlayer dielectric layer formed on the source/drain doped region, wherein, after providing the base substrate and prior to removing the cap layer, the method further includes:
        forming a contact hole in the interlayer dielectric layer using the cap layer as a mask to expose the source/drain doped region at a bottom of the contact hole; and
        forming a plug in the contact hole.

6. The method according to claim 5, wherein forming the substitution layer in the trench includes:
    forming a substitution material layer in the trench, wherein the substitution material layer also covers the interlayer dielectric layer; and
    forming the substitution layer by removing a portion of the substitution material layer formed above a top surface of the interlayer dielectric layer.

7. The method according to claim 6, wherein:
    the substitution material layer formed in the trench contains a plurality of internal cavities;
    the substitution layer formed by removing the portion of the substitution material layer formed above the top surface of the interlayer dielectric layer contains a plurality of internal cavities; and
    the substitution material layer is formed by one or both of an atmospheric pressure chemical vapor deposition (APCVD) process and a subatmospheric pressure chemical vapor deposition (SACVD) process.

8. The method according to claim 7, wherein:
    the plurality of internal cavities are formed in the substitution layer on top of the remaining portion of the gate dielectric layer and the remaining portion of the work function layer.

9. The method according to claim 6, wherein:
    the substitution material layer fills up the trench;
    the substitution layer, formed by removing the portion of the substitution material layer above the top surface of the interlayer dielectric layer, fills up the trench; and
    the substitution material layer is formed by one or both of a plasma enhanced chemical vapor deposition (PECVD) process and a high density plasma chemical vapor deposition (HDPCVD) process.

10. The method according to claim 1, wherein:
    the work function layer and the gate dielectric layer also cover sidewall surfaces of the gate electrode layer; and
    the trench exposes a top surface of the gate electrode layer as well as a portion of the sidewall surfaces of the gate electrode layer.

11. The method according to claim 10, wherein:
    a ratio of a height of the portion of the sidewall surfaces of the gate electrode layer exposed at a bottom of the trench to a height of the gate electrode layer is in a range of approximately 1:6 to 1:1.

12. The method according to claim 1, wherein:
    a thickness of the removed portion of the sidewall spacer is in a range of approximately 10 Å to 100 Å.

13. The method according to claim 1, wherein:
the substitution layer is formed on the remaining portion of the gate dielectric layer, the top surface of the remaining portion of the work function layer, and the top surface of the bottom portion of the sidewall spacer.

14. The method according to claim 1, wherein:
a remaining portion of the top portion of the sidewall spacer has a uniform first thickness,
the bottom portion of the sidewall spacer has a uniform second thickness, and
the uniform first thickness is smaller than the uniform second thickness.

\* \* \* \* \*